(12) United States Patent
Davis et al.

(10) Patent No.: US 7,960,818 B1
(45) Date of Patent: Jun. 14, 2011

(54) CONFORMAL SHIELD ON PUNCH QFN SEMICONDUCTOR PACKAGE

(75) Inventors: Terry W. Davis, Gilbert, AZ (US); Sun Jin Son, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 71 days.

(21) Appl. No.: 12/398,089

(22) Filed: Mar. 4, 2009

(51) Int. Cl.
*H01L 23/495* (2006.01)

(52) U.S. Cl. ........................................ 257/675; 257/676

(58) Field of Classification Search .................. 257/675, 257/676
See application file for complete search history.

(56) References Cited

U.S. PATENT DOCUMENTS

| | | |
|---|---|---|
| 2,596,993 A | 5/1952 | Gookin |
| 3,435,815 A | 4/1969 | Forcier |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,221,925 A | 9/1980 | Finley et al. |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |
| 4,417,266 A | 11/1983 | Grabbe |
| 4,451,224 A | 5/1984 | Harding |
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorpe, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |

(Continued)

FOREIGN PATENT DOCUMENTS

DE 19734794 A1 8/1997

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner* — Phat X Cao
(74) *Attorney, Agent, or Firm* — Stetina Brunda Garred & Brucker

(57) ABSTRACT

In accordance with the present invention, there is provided a punch quad flat no leads (QFN) semiconductor package including a leadframe wherein the leads of the leadframe are selectively half-etched so that only one or more prescribed leads may be electrically connected to a conformal shield applied to the package body of the semiconductor package. The conformal shield may be electrically connected to the exposed lead(s) alone, or in combination with one or more tie bars of the leadframe. In one embodiment, outer end portions of the top surfaces of the leads of the semiconductor package are alternately exposed and non-exposed, with the non-exposed leads including a top side half-etch which causes the same to be effectively covered by the package body of the semiconductor package.

20 Claims, 4 Drawing Sheets

U.S. PATENT DOCUMENTS

| | | | |
|---|---|---|---|
| 4,920,074 A | 4/1990 | Shimizu et al. |
| 4,925,024 A | 5/1990 | Ellenberger et al. |
| 4,935,803 A | 6/1990 | Kalfus et al. |
| 4,942,454 A | 7/1990 | Mori et al. |
| 4,987,475 A | 1/1991 | Sclesinger et al. |
| 5,018,003 A | 5/1991 | Yasunaga |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson et al. |
| 5,118,298 A | 6/1992 | Murphy |
| 5,122,860 A | 6/1992 | Kichuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,166,772 A | 11/1992 | Soldner et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,285,352 A | 2/1994 | Pastore et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,416,358 A | 5/1995 | Ochi et al. |
| 5,417,905 A | 5/1995 | LeMaire et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,467,032 A | 11/1995 | Lee |
| 5,468,999 A | 11/1995 | Lin et al. |
| 5,473,191 A | 12/1995 | Tanaka |
| 5,474,958 A | 12/1995 | Djennas et al. |
| 5,484,274 A | 1/1996 | Neu |
| 5,490,271 A | 2/1996 | Elliott et al. |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,557,142 A | 9/1996 | Gilmore et al. |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,614,694 A | 3/1997 | Gorenz, Jr. |
| 5,625,222 A | 4/1997 | Yoneda et al. |
| 5,633,528 A | 5/1997 | Abbott et al. |
| 5,637,922 A | 6/1997 | Fillion et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasaranthi |
| 5,656,864 A | 8/1997 | Mitsue et al. |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,683,943 A | 11/1997 | Yamada |
| 5,689,135 A | 11/1997 | Ball |
| 5,694,300 A | 12/1997 | Mattei et al. |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,767,566 A | 6/1998 | Suda |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davies et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,854,511 A | 12/1998 | Shin et al. |
| 5,854,512 A | 12/1998 | Manteghi |
| 5,856,911 A | 1/1999 | Riley |
| 5,859,471 A | 1/1999 | Kuraishi et al. |
| 5,866,939 A | 2/1999 | Shin et al. |
| 5,866,942 A | 2/1999 | Suzuki et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,907,271 A | 5/1999 | Hirano et al. |
| 5,973,935 A | 10/1999 | Schoenfeld et al. |
| 5,977,630 A | 11/1999 | Woodworth et al. |
| RE36,773 E | 7/2000 | Nomi et al. |
| 6,107,679 A | 8/2000 | Noguchi |
| 6,136,131 A | 10/2000 | Sosnowski |
| 6,143,981 A | 11/2000 | Glenn |
| 6,150,709 A | 11/2000 | Shin et al. |
| 6,166,430 A | 12/2000 | Yamaguchi |
| 6,169,329 B1 | 1/2001 | Farnworth et al. |
| 6,177,718 B1 | 1/2001 | Kozono |
| 6,181,002 B1 | 1/2001 | Juso et al. |

| | | | | | | |
|---|---|---|---|---|---|---|
| 6,184,465 B1 | 2/2001 | Corisis | | 6,452,279 B2 | 9/2002 | Shimoda |
| 6,184,573 B1 | 2/2001 | Pu | | 6,459,148 B1 | 10/2002 | Chun-Jen et al. |
| 6,194,655 B1 | 2/2001 | Lang, Sr. et al. | | 6,464,121 B2 | 10/2002 | Reijinders |
| 6,194,777 B1 | 2/2001 | Abbott et al. | | 6,465,280 B1 | 10/2002 | Martin et al. |
| 6,197,615 B1 | 3/2001 | Song et al. | | 6,465,883 B2 | 10/2002 | Olofsson |
| 6,198,171 B1 | 3/2001 | Huang et al. | | 6,472,735 B2 | 10/2002 | Isaak |
| 6,201,186 B1 | 3/2001 | Daniels et al. | | 6,475,646 B2 | 11/2002 | Park et al. |
| 6,201,292 B1 | 3/2001 | Yagi et al. | | 6,476,469 B2 | 11/2002 | Hung et al. |
| 6,204,554 B1 | 3/2001 | Ewer et al. | | 6,476,474 B1 | 11/2002 | Hung |
| 6,208,020 B1 | 3/2001 | Minamio et al. | | 6,482,680 B1 | 11/2002 | Khor et al. |
| 6,208,021 B1 | 3/2001 | Ohuchi et al. | | 6,483,178 B1 | 11/2002 | Chuang |
| 6,208,023 B1 | 3/2001 | Nakayama et al. | | 6,492,718 B2 | 12/2002 | Ohmori et al. |
| 6,211,462 B1 | 4/2001 | Carter, Jr. et al. | | 6,495,909 B2 | 12/2002 | Jung et al. |
| 6,218,731 B1 | 4/2001 | Huang et al. | | 6,498,099 B1 | 12/2002 | McClellan et al. |
| 6,222,258 B1 | 4/2001 | Asano et al. | | 6,498,392 B2 | 12/2002 | Azuma |
| 6,222,259 B1 | 4/2001 | Park et al. | | 6,507,096 B2 | 1/2003 | Gang |
| 6,225,146 B1 | 5/2001 | Yamaguchi et al. | | 6,507,120 B2 | 1/2003 | Lo et al. |
| 6,229,200 B1 | 5/2001 | McClellan et al. | | 6,518,089 B2 | 2/2003 | Coyle |
| 6,229,205 B1 | 5/2001 | Jeong et al. | | 6,525,942 B2 | 2/2003 | Huang et al. |
| 6,238,952 B1 | 5/2001 | Lin et al. | | 6,528,893 B2 | 3/2003 | Jung et al. |
| 6,239,367 B1 | 5/2001 | Hsuan et al. | | 6,534,849 B1 | 3/2003 | Gang |
| 6,239,384 B1 | 5/2001 | Smith et al. | | 6,545,332 B2 | 4/2003 | Huang |
| 6,242,281 B1 | 6/2001 | McClellan et al. | | 6,545,345 B1 | 4/2003 | Glenn et al. |
| 6,246,115 B1 | 6/2001 | Tang et al. | | 6,552,421 B2 | 4/2003 | Kishimoto et al. |
| 6,256,200 B1 | 7/2001 | Lam et al. | | 6,559,525 B2 | 5/2003 | Huang |
| 6,258,629 B1 | 7/2001 | Niones et al. | | 6,566,168 B2 | 5/2003 | Gang |
| 6,261,864 B1 | 7/2001 | Jung et al. | | 6,580,161 B2 | 6/2003 | Kobayakawa |
| 6,281,566 B1 | 8/2001 | Magni | | 6,583,503 B2 | 6/2003 | Akram et al. |
| 6,281,568 B1 | 8/2001 | Glenn et al. | | 6,585,905 B1 | 7/2003 | Fan et al. |
| 6,282,094 B1 | 8/2001 | Lo et al. | | 6,602,737 B2 | 8/2003 | Wu |
| 6,282,095 B1 | 8/2001 | Houghton et al. | | 6,603,196 B2 | 8/2003 | Lee et al. |
| 6,285,075 B1 | 9/2001 | Combs et al. | | 6,605,865 B2 * | 8/2003 | Jeong et al. .................. 257/670 |
| 6,291,271 B1 | 9/2001 | Lee et al. | | 6,624,005 B1 | 9/2003 | DiCaprio et al. |
| 6,291,273 B1 | 9/2001 | Miyaki et al. | | 6,627,977 B1 | 9/2003 | Foster |
| 6,294,100 B1 | 9/2001 | Fan et al. | | 6,639,989 B1 | 10/2003 | Zacharov et al. |
| 6,294,830 B1 | 9/2001 | Fjelstad | | 6,646,339 B1 | 11/2003 | Ku |
| 6,295,977 B1 | 10/2001 | Ripper et al. | | 6,667,546 B2 | 12/2003 | Huang et al. |
| 6,297,548 B1 | 10/2001 | Moden et al. | | 6,677,663 B1 | 1/2004 | Ku et al. |
| 6,303,984 B1 | 10/2001 | Corisis | | 6,686,649 B1 | 2/2004 | Matthews et al. |
| 6,303,997 B1 | 10/2001 | Lee | | 6,696,752 B2 | 2/2004 | Su et al. |
| 6,306,685 B1 | 10/2001 | Liu et al. | | 6,700,189 B2 | 3/2004 | Shibata |
| 6,307,272 B1 | 10/2001 | Takahashi et al. | | 6,713,375 B2 | 3/2004 | Shenoy |
| 6,309,909 B1 | 10/2001 | Ohgiyama | | 6,757,178 B2 | 6/2004 | Okabe et al. |
| 6,316,822 B1 | 11/2001 | Vekateshwaran et al. | | 6,800,936 B2 | 10/2004 | Kosemura et al. |
| 6,316,838 B1 | 11/2001 | Ozawa et al. | | 6,812,552 B2 | 11/2004 | Islam et al. |
| 6,323,550 B1 | 11/2001 | Martin et al. | | 6,818,973 B1 | 11/2004 | Foster |
| 6,326,243 B1 | 12/2001 | Suzuya et al. | | 6,858,919 B2 | 2/2005 | Seo et al. |
| 6,326,244 B1 | 12/2001 | Brooks et al. | | 6,867,492 B2 | 3/2005 | Auburger et al. |
| 6,326,678 B1 | 12/2001 | Karmezos et al. | | 6,876,068 B1 | 4/2005 | Lee et al. |
| 6,335,564 B1 | 1/2002 | Pour | | 6,878,571 B2 | 4/2005 | Isaak et al. |
| 6,337,510 B1 | 1/2002 | Chun-Jen et al. | | 6,897,552 B2 | 5/2005 | Nakao |
| 6,339,252 B1 | 1/2002 | Niones et al. | | 6,927,478 B2 | 8/2005 | Paek |
| 6,339,255 B1 | 1/2002 | Shin | | 6,967,125 B2 | 11/2005 | Fee et al. |
| 6,342,730 B1 | 1/2002 | Jung et al. | | 6,995,459 B2 | 2/2006 | Lee et al. |
| 6,348,726 B1 | 2/2002 | Bayan et al. | | 7,002,805 B2 | 2/2006 | Lee et al. |
| 6,355,502 B1 | 3/2002 | Kang et al. | | 7,005,327 B2 | 2/2006 | Kung et al. |
| 6,359,221 B1 | 3/2002 | Yamada et al. | | 7,015,571 B2 | 3/2006 | Chang et al. |
| 6,362,525 B1 | 3/2002 | Rahim | | 7,030,469 B2 | 4/2006 | Mahadevan et al. |
| 6,369,447 B2 | 4/2002 | Mori | | 7,045,396 B2 | 5/2006 | Crowley et al. |
| 6,369,454 B1 | 4/2002 | Chung | | 7,053,469 B2 | 5/2006 | Koh et al. |
| 6,373,127 B1 | 4/2002 | Baudouin et al. | | 7,075,816 B2 | 7/2006 | Fee et al. |
| 6,377,464 B1 | 4/2002 | Hashemi et al. | | 7,102,209 B2 | 9/2006 | Bayan et al. |
| 6,380,048 B1 | 4/2002 | Boon et al. | | 7,109,572 B2 | 9/2006 | Fee et al. |
| 6,384,472 B1 | 5/2002 | Huang | | 7,185,426 B1 | 3/2007 | Hiner et al. |
| 6,388,336 B1 | 5/2002 | Venkateshwaran et al. | | 7,193,298 B2 | 3/2007 | Hong et al. |
| 6,395,578 B1 | 5/2002 | Shin et al. | | 7,211,471 B1 | 5/2007 | Foster |
| 6,399,415 B1 | 6/2002 | Bayan et al. | | 7,245,007 B1 | 7/2007 | Foster |
| 6,400,004 B1 | 6/2002 | Fan et al. | | 7,253,503 B1 | 8/2007 | Fusaro et al. |
| 6,410,979 B2 | 6/2002 | Abe | | 2001/0008305 A1 | 7/2001 | McClellan et al. |
| 6,414,385 B1 | 7/2002 | Huang et al. | | 2001/0014538 A1 | 8/2001 | Kwan et al. |
| 6,420,779 B1 | 7/2002 | Sharma et al. | | 2002/0011654 A1 | 1/2002 | Kimura |
| 6,421,013 B1 | 7/2002 | Chung | | 2002/0024122 A1 | 2/2002 | Jung et al. |
| 6,423,570 B1 | 7/2002 | Ma et al. | | 2002/0027297 A1 | 3/2002 | Ikenaga et al. |
| 6,423,643 B1 | 7/2002 | Furuhata et al. | | 2002/0038873 A1 | 4/2002 | Hiyoshi |
| 6,429,508 B1 | 8/2002 | Gang | | 2002/0072147 A1 | 6/2002 | Sayanagi et al. |
| 6,433,420 B1 | 8/2002 | Yang et al. | | 2002/0089833 A1 | 7/2002 | Patel et al. |
| 6,437,429 B1 | 8/2002 | Su et al. | | 2002/0111009 A1 | 8/2002 | Huang et al. |
| 6,444,499 B1 | 9/2002 | Swiss et al. | | 2002/0140061 A1 | 10/2002 | Lee |
| 6,448,633 B1 | 9/2002 | Yee et al. | | 2002/0140068 A1 | 10/2002 | Lee et al. |

| | | | | | |
|---|---|---|---|---|---|
| 2002/0140081 A1 | 10/2002 | Chou et al. | JP | 1106456 | 4/1989 |
| 2002/0158318 A1 | 10/2002 | Chen | JP | 1175250 | 7/1989 |
| 2002/0163015 A1 | 11/2002 | Lee et al. | JP | 1205544 | 8/1989 |
| 2002/0167060 A1 | 11/2002 | Buijsman et al. | JP | 1251747 | 10/1989 |
| 2003/0006055 A1 | 1/2003 | Chien-Hung et al. | JP | 2129948 | 5/1990 |
| 2003/0030131 A1 | 2/2003 | Lee et al. | JP | 369248 | 7/1991 |
| 2003/0059644 A1 | 3/2003 | Datta et al. | JP | 3177060 | 8/1991 |
| 2003/0064548 A1 | 4/2003 | Isaak | JP | 3289162 | 12/1991 |
| 2003/0073265 A1 | 4/2003 | Hu et al. | JP | 4098864 | 3/1992 |
| 2003/0102537 A1 | 6/2003 | McLellan et al. | JP | 5129473 | 5/1993 |
| 2003/0164554 A1 | 9/2003 | Fee et al. | JP | 5166992 | 7/1993 |
| 2003/0168719 A1 | 9/2003 | Cheng et al. | JP | 5283460 | 10/1993 |
| 2003/0198032 A1 | 10/2003 | Collander et al. | JP | 6061401 | 3/1994 |
| 2004/0027788 A1 | 2/2004 | Chiu et al. | JP | 692076 | 4/1994 |
| 2004/0056277 A1 | 3/2004 | Karnezos | JP | 6140563 | 5/1994 |
| 2004/0061212 A1 | 4/2004 | Karnezos | JP | 652333 | 9/1994 |
| 2004/0061213 A1 | 4/2004 | Karnezos | JP | 6252333 | 9/1994 |
| 2004/0063242 A1 | 4/2004 | Karnezos | JP | 6260532 | 9/1994 |
| 2004/0063246 A1 | 4/2004 | Karnezos | JP | 7297344 | 11/1995 |
| 2004/0065963 A1 | 4/2004 | Karnezos | JP | 7312405 | 11/1995 |
| 2004/0080025 A1 | 4/2004 | Kasahara et al. | JP | 8064364 | 3/1996 |
| 2004/0089926 A1 | 5/2004 | Hsu et al. | JP | 8083877 | 3/1996 |
| 2004/0097016 A1* | 5/2004 | Yee et al. ............ 438/124 | JP | 8125066 | 5/1996 |
| 2004/0164387 A1 | 8/2004 | Ikenaga et al. | JP | 964284 | 6/1996 |
| 2004/0253803 A1 | 12/2004 | Tomono et al. | JP | 8222682 | 8/1996 |
| 2005/0104194 A1* | 5/2005 | Weng et al. ............ 257/706 | JP | 8306853 | 11/1996 |
| 2005/0280139 A1 | 12/2005 | Zhao et al. | JP | 98205 | 1/1997 |
| 2006/0067757 A1 | 3/2006 | Anderson et al. | JP | 98206 | 1/1997 |
| 2006/0087020 A1 | 4/2006 | Hirano et al. | JP | 98207 | 1/1997 |
| 2006/0157843 A1 | 7/2006 | Hwang | JP | 992775 | 4/1997 |
| 2006/0231939 A1 | 10/2006 | Kawabata et al. | JP | 9260568 | 10/1997 |
| 2007/0023202 A1 | 2/2007 | Shibata | JP | 9293822 | 11/1997 |
| 2007/0030661 A1 | 2/2007 | Morris et al. | JP | 10022447 | 1/1998 |
| 2008/0006916 A1* | 1/2008 | Danno et al. ............ 257/676 | JP | 10199934 | 7/1998 |
| 2008/0230887 A1 | 9/2008 | Sun et al. | JP | 10256240 | 9/1998 |
| | | | JP | 11307675 | 11/1999 |
| | FOREIGN PATENT DOCUMENTS | | JP | 2000150765 | 5/2000 |
| | | | JP | 20010600648 | 3/2001 |
| EP | 0393997 | 10/1990 | JP | 2002519848 | 7/2002 |
| EP | 0459493 | 12/1991 | JP | 200203497 | 8/2002 |
| EP | 0720225 | 3/1996 | JP | 2003243595 | 8/2003 |
| EP | 0720234 | 3/1996 | JP | 2004158753 | 6/2004 |
| EP | 0794572 A2 | 10/1997 | KR | 941979 | 1/1994 |
| EP | 0844665 | 5/1998 | KR | 19940010938 | 5/1994 |
| EP | 0936671 | 8/1999 | KR | 19950018924 | 6/1995 |
| EP | 0989608 | 3/2000 | KR | 19950041844 | 11/1995 |
| EP | 1032037 | 8/2000 | KR | 19950044554 | 11/1995 |
| JP | 55163868 | 12/1980 | KR | 19950052621 | 12/1995 |
| JP | 5745959 | 3/1982 | KR | 1996074111 | 12/1996 |
| JP | 58160096 | 8/1983 | KR | 9772358 | 11/1997 |
| JP | 59208756 | 11/1984 | KR | 100220154 | 6/1999 |
| JP | 59227143 | 12/1984 | KR | 20000072714 | 12/2000 |
| JP | 60010756 | 1/1985 | KR | 20000086238 | 12/2000 |
| JP | 60116239 | 8/1985 | KR | 20020049944 | 6/2002 |
| JP | 60195957 | 10/1985 | WO | 9956316 | 11/1999 |
| JP | 60231349 | 11/1985 | WO | 9967821 | 12/1999 |
| JP | 6139555 | 2/1986 | | | |
| JP | 61248541 | 11/1986 | | OTHER PUBLICATIONS | |
| JP | 629639 | 1/1987 | | | |
| JP | 6333854 | 2/1988 | | | |
| JP | 63067762 | 3/1988 | | | |
| JP | 63188964 | 8/1988 | | | |
| JP | 63205935 | 8/1988 | | | |
| JP | 63233555 | 9/1988 | | | |
| JP | 63249345 | 10/1988 | | | |
| JP | 63289951 | 11/1988 | | | |
| JP | 63316470 | 12/1988 | | | |
| JP | 64054749 | 3/1989 | | | |

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

CONFORMAL SHIELD ON PUNCH QFN SEMICONDUCTOR PACKAGE

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to semiconductor packages, and more particularly to a punch quad flat no leads (QFN) semiconductor package which includes one or more leads exposed in the package body of the semiconductor package in a manner making such lead(s) suitable for electrical connection to a conformal shield of the semiconductor package.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package comprise a metal leadframe, an integrated circuit or semiconductor die, bonding material to attach the semiconductor die to the leadframe, bond wires which electrically connect pads or contacts on the semiconductor die to individual leads of the leadframe, and a hard plastic encapsulant material which covers the other components and forms the exterior of the semiconductor package, commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe may extend externally from the package body, or may be partially exposed therein for use in electrically connecting the semiconductor package to another component. In certain semiconductor packages, a portion of the die pad of the leadframe also remains exposed within the package body.

In an often used methodology for fabricating a plurality of the above-described semiconductor packages, a matrix of interconnected leadframes are etched into a leadframe strip. Subsequent to the attachment of the semiconductor dies to respective ones of the die pads of the leadframes and the electrical connection of the pads of the semiconductor dies to the leads of the corresponding leadframes, an encapsulation step facilitates the application of the encapsulant material onto the surface of the leadframe strip to which the semiconductor dies are attached. This encapsulation step covers the semiconductor dies, the side surfaces of the die pads, and portions of the leads within a single block of encapsulant material. The encapsulant material is then hardened, with a cutting step thereafter being used to separate individual semiconductor packages from each other and from the disposable portions of each of the leadframes within the leadframe strip. The cutting step severs the connection between each of the interconnected leadframes within the leadframe strip, and the die pad and leads of each individual leadframe. This cutting or "singulation" process is typically accomplished through either a sawing process (saw singulation) or a punching process (punch singulation). As indicated above, the formation of the individual leadframes within the leadframe strip is itself typically accomplished through either a chemical etching or mechanical stamping process.

One type of semiconductor package commonly including a leadframe is a quad flat no leads (QFN) package. QFN semiconductor packages or devices are particularly advantageous for their smaller size and superior electrical performance. A typical QFN package comprises a thin, generally square package body defining four peripheral sides of substantially equal length. Exposed in the bottom surface of the package body are portions of each of the leads, such exposed portions defining lands or terminals which are used to facilitate the electrical connection of the QFN package to an external device. The lands or terminals defined by the leads are typically segregated into four sets, with the terminals of each set extending along a respective one of the four peripheral sides of the package body. The semiconductor die is itself mounted to a die pad of the QFN package leadframe, with that surface of the die pad opposite to that which the semiconductor die is attached sometimes being exposed in that surface of the package body in which the terminals defined by the leads are also exposed. As indicated above, the pads or contacts of the semiconductor die are electrically connected to the leads, and typically the top surfaces of the leads which are opposite the bottom surfaces thereof defining the exposed terminals.

In standard QFN packages formed through the use of punch singulation, distal or outer end portions of the top surfaces of the leads are also exposed in the fully formed package body. In addition, distal, outer end portions of the top surfaces of the tie bars extending from respective corners of the die pad are also exposed in the same surface of the package body in which the outer end portions of the top surfaces of leads are exposed. In punch QFN packages having a black top or ED design, the package body is formed such that only the lands or terminals defined by the leads and one surface of the die pad are exposed therein, i.e., the outer end portions of the top surfaces of the leads and tie bars are covered by the package body.

As the art has moved to smaller, lighter weight, and higher frequency electronic devices such as cellular telephones, semiconductor packages utilized in these electronic devices are increasingly placed closer to other electronic components and structures. Due to this reduced spacing, radiation such as electromagnetic or radio frequency (RF) radiation emanating from a semiconductor package has a greater probability of interfering with the normal operation of an adjacent electronic component, and vice-versa. To prevent such unacceptable electromagnetic interference, it is known in the prior art to apply a conformal radiation shield to the package body of the semiconductor package.

In those QFN packages to which a conformal shield is applied, it is advantageous to place such conformal shield into electrical communication with one or more of the tie bars and/or one or more of the leads of the semiconductor package. However, for punch QFN packages having the aforementioned black top or ED design, such electrical communication between the conformal shield and the leads and/or tie bars is not possible since, as indicated above, the tie bars are completely covered by the package body, as are the top surfaces of the leads opposite the terminals defined by the bottom surfaces thereof. Though outer end portions of the top surfaces of the leads and tie bars are typically exposed in the package body of the standard punch QFN package also described above, it is often not desirable to have to electrically connect all of the leads and tie bars to the conformal shield subsequently formed on the package body. The present invention addresses this issue by, among other things, providing a punch QFN package in which the outer end portions of the top surfaces of only one or more selected leads and/or tie bars is/are exposed, thus allowing for the electrical connection of the conformal shield thereto. These, as well as other features and advantages of the present invention will be discussed in more detail below.

BRIEF SUMMARY OF THE INVENTION

In accordance with the present invention, there is provided a punch quad flat no leads (QFN) semiconductor package including a leadframe wherein the leads of the leadframe are selectively half-etched so that only one or more prescribed leads may be electrically connected to a conformal shield applied to the package body of the semiconductor package. The conformal shield may be electrically connected to the exposed lead(s) alone, or in combination with one or more tie bars of the leadframe. In one embodiment, outer end portions of the top surfaces of the leads of the semiconductor package are alternately exposed and non-exposed, with the non-exposed leads including a top side half-etch which causes the same to be effectively covered by the package body of the semiconductor package. The exposed lead(s) and/or tie bar(s) may be placed into electrical communication with the conformal shield as indicated above.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
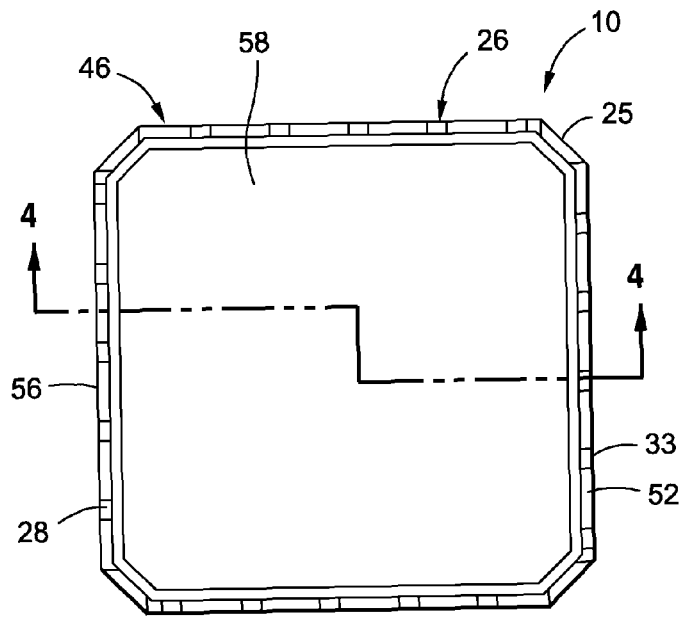
FIG. 1 is a top plan view of a semiconductor package constructed in accordance with the present invention.
Figure 2:
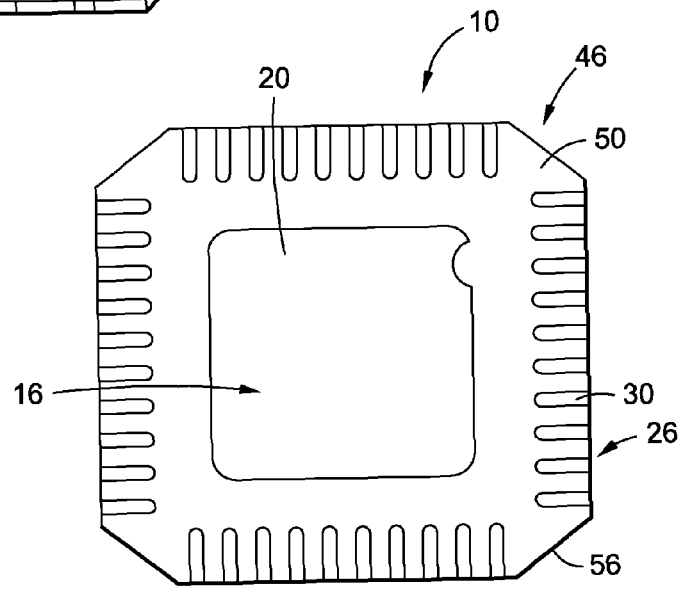
FIG. 2 is a bottom plan view of the semiconductor package shown in FIG. 1.
Figure 3:
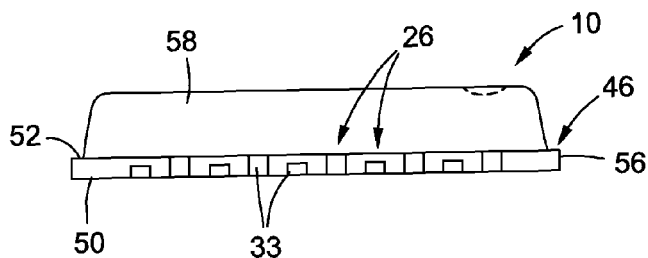
FIG. 3 is a side-elevational view of the semiconductor package shown in FIGS. 1 and 2.

Referring now to the drawings wherein the showings are for purposes of illustrating a preferred embodiment of the present invention only, and not for purposes of limiting the same, FIGS. 1-3 depict a semiconductor package 10 constructed in accordance with the present invention. As will be described in more detail below, the semiconductor package 10 is a quad flat no leads (QFN) package which is preferably formed through the implementation of a punch singulation process.

Figure 4:
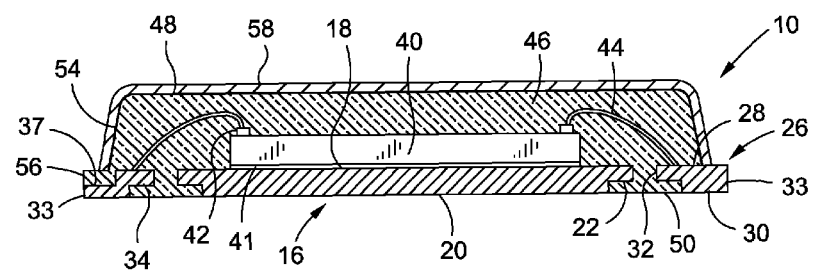
FIG. 4 is a cross-sectional view taken along line 4-4 of FIG. 1.

One the primary structural features of the semiconductor package 10 is its leadframe 12. The leadframe 12 of the semiconductor package 10 is shown in its original unsingulated state in FIGS. 5 and 5A. More particularly, the leadframe 12 comprises an outer frame or dambar (not shown) which has a generally quadrangular configuration, and defines a central opening 14. Disposed within the opening 14 of the dambar is a die paddle or die pad 16 of the leadframe 12. Like the dambar, the die pad 16 also has a generally quadrangular (e.g., square) configuration, and defines four peripheral edge segments. As seen in FIG. 4, the die pad 16 also defines a generally planar top surface 18, and an opposed, generally planar bottom surface 20. In the process of fabricating the leadframe 12, the die pad 16 is preferably subjected to a partial etching process which facilitates the formation of a recessed shoulder or shelf 22 therein.

Figure 5:
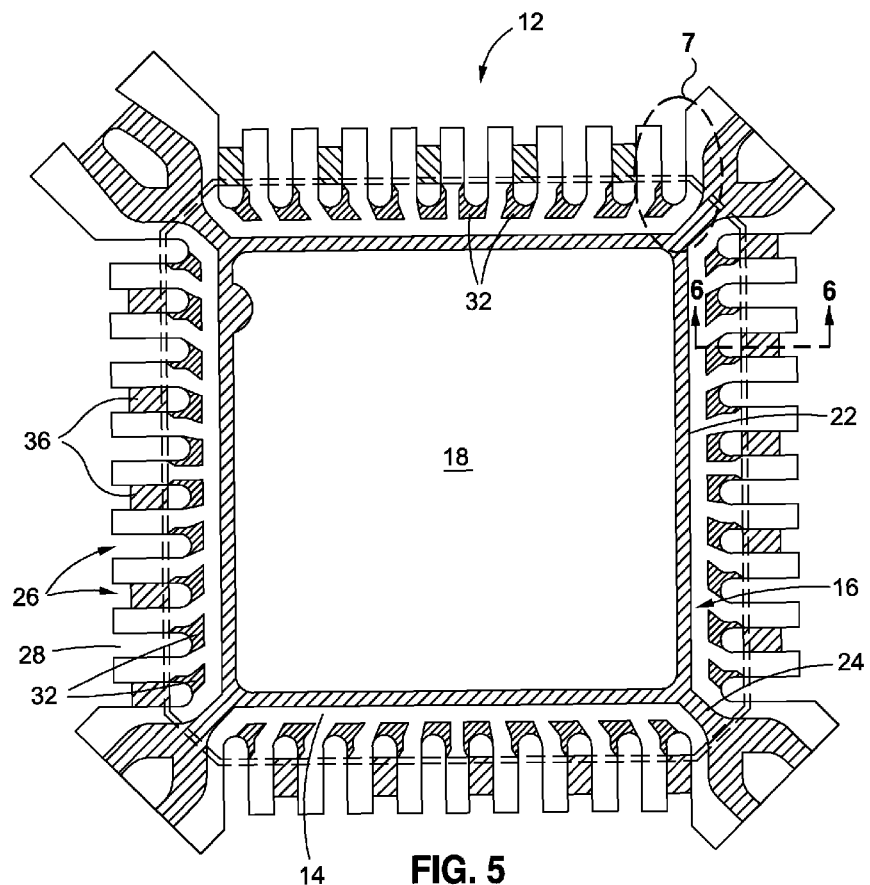
FIG. 5 is a top plan view of the leadframe integrated into the semiconductor package shown in FIGS. 1-4, prior to the singulation thereof.

As shown in FIGS. 4 and 5, the shelf 22 (which is also shown by the hatching including on the die pad 16 in FIG. 5) substantially circumvents the bottom surface 20 of the die pad 16, and is disposed in opposed relation to the peripheral portion of the top surface 18 thereof. As also seen in FIG. 4, the depth of the shelf 22 is preferably about half of the total thickness of the die pad 16 (i.e., the distance separating the top and bottom surfaces 18, 20 from each other). The functionality of the shelf 22 will be discussed in more detail below.

In the leadframe 12, the die pad 16 is supported or suspended within the opening 14 through the use of a plurality of tie bars 24. As further seen in FIG. 5, the tie bars 24 are integrally connected to and extend diagonally from respective ones of the four corner regions defined by the die pad 16. Those ends of the tie bars 24 opposite those connected to the die pad 16 are integrally connected to the dambar of the leadframe 12. Each of the tie bars 24 defines a generally planar top surface which extends in generally co-planar relation to the top surface 18 of the die pad 16. As is also shown by the hatching included in FIG. 5, during the fabrication of the leadframe 12, each of the tie bars 24 is preferably subjected to a partial etching process which results in each of the tie bars 24 defining a bottom surface which extends in generally co-planar relation to the shelf 22.

In addition to the die pad 16 and tie bars 24, the leadframe 12 comprises a plurality of leads 26. In the leadframe 12, the leads 26 are preferably segregated into four sets, with each set of the leads 26 being integrally connected to the dambar and extending within the opening 14 toward a respective one of the peripheral edge segments defined by the die pad 16. As is apparent from FIG. 5, each of the leads 26 extends generally perpendicularly from the dambar of the leadframe 12, and is sized so as to be maintained in spaced relation to (i.e., not to contact) the corresponding peripheral edge segment of the die pad 16.

Figure 6:
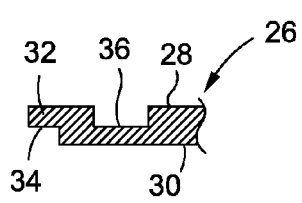
FIG. 6 is a cross-sectional view taken along line 6-6 of FIG. 5.

Referring now to FIGS. 5 and 6, each of the leads 26 defines a generally planar top surface 28 and an opposed, generally planar bottom surface 30. The top surface 28 extends in generally co-planar relation to the top surface 18 of the die pad 16, as well as the top surfaces of the tie bars 24. The bottom surface 30 of each lead 26 extends in generally co-planar relation to the bottom surface 20 of the die pad 16. As seen in FIG. 5, the leads 26 are not all identically configured to each other. In this regard, each of the leads 26 is preferably formed to include an inner end portion 32 which is angularly offset relative to the remainder thereof. As further seen in FIG. 5, ten leads 26 are included within each set thereof. Each set of ten includes five pairs of identically configured leads 26, i.e., pairs of leads 26 having inner end portions 32 of substantially equal angular offsets. As is also apparent from FIG. 5, the angular offsets of the inner end portions 32 of the leads 26 relative to the remainders thereof progressively increases as the leads 26 approach respective ones of the corresponding pair of tie bars 24 between which such set of leads 26 is positioned. Those of ordinary skill in the art will recognize that the inclusion of ten leads 26 within each set thereof as shown in FIG. 5 and described above is exemplary only, and that more or less than ten leads 26 may be included in each such set without departing from the spirit and scope of the present invention.

In fabricating the leadframe 12, each lead 26 is subjected to a partial etching process which results in the inner end portion 32 thereof being of a reduced thickness as is shown with particularity in FIG. 6 and is indicated by the cross-hatching included in FIG. 5. As is apparent from FIG. 6, it is contemplated that the partial etching of each lead 26 will be completed such that the thickness of the inner end portion 32 is approximately one-half the total thickness of the lead 26 (i.e., the distance between the top and bottom surfaces 28, 30). Additionally, the partial or half-etching of the inner end portion 32 of each lead 26 preferably occurs such that upon the completion of the etching process, each inner end portion 32 defines a shelf 34 which is recessed relative to the bottom surface 30. In the leadframe 12, the shelf 34 of the inner end portion 32 of each lead 26 extends in generally co-planar relation to the shelf 22 of the die pad 16 and the bottom surfaces of the tie bars 24.

Figure 5A:
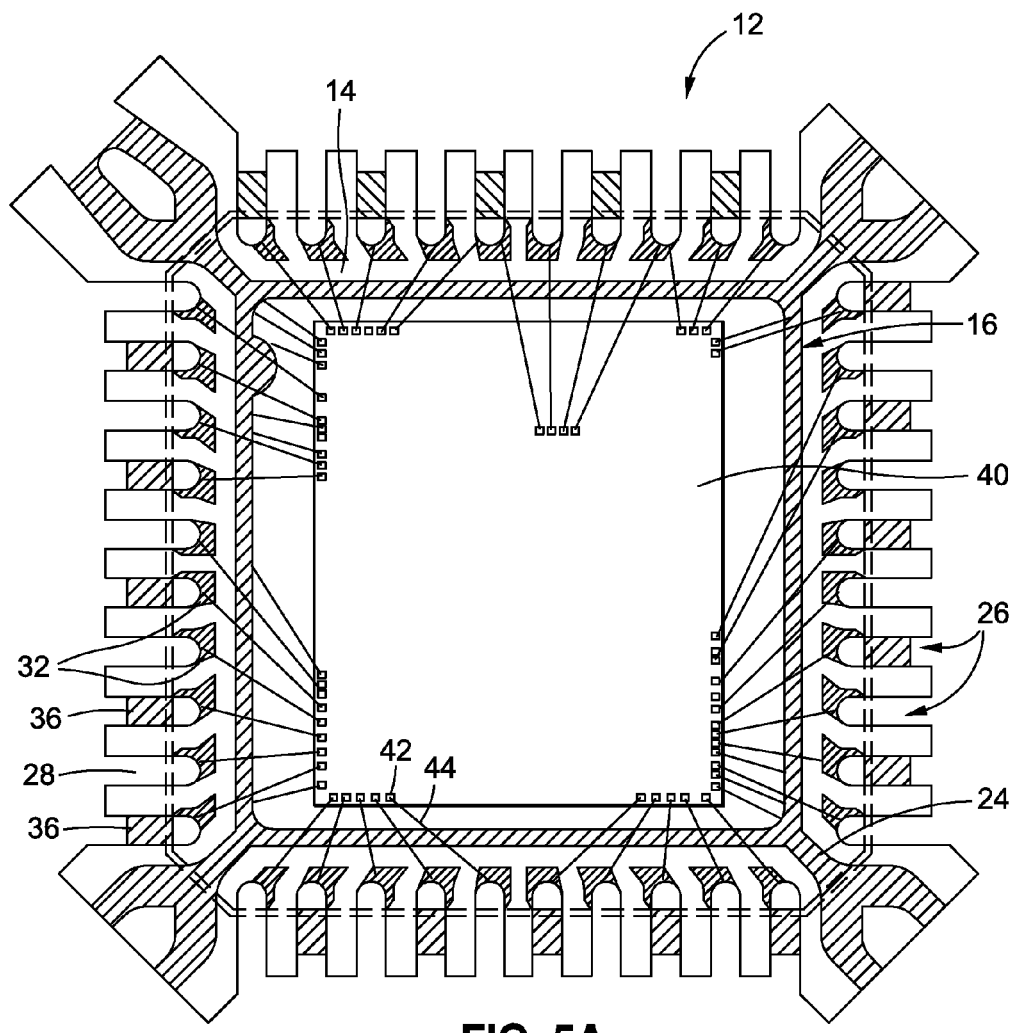
FIG. 5A is a top plan view of the leadframe shown in FIG. 5 but further illustrating the semiconductor die of the semiconductor package as attached to the die pad of the leadframe and electrically connected to the leads thereof through the use of conductive wires prior to the formation of the package body of the semiconductor package.

The partial etching process to which the leads 26 are subjected is further completed in a manner facilitating the formation of a recess 36 within the top surface 28 of one or more of the leads 26. As shown in FIGS. 5 and 5A, every other lead 26 in each set thereof (for a total of five leads 26 per set) is partially etched to define a recess 36. However, those of ordinary skill in the art will recognize that this particular distribution of recesses 36 is exemplary only, and that any lead(s) 26 of any set thereof may be formed to include a recess 36, or formed so as not to include a recess 36. Along these lines, it is contemplated that at least one (and typically more than one) of the leads 26 included in the leadframe 12 will be partially etched to include a recess 36. The recesses 36 are also indicated by the hatching shown in FIG. 5. Within each lead 26 including a recess 36, the depth of the recess 36 is preferably substantially equal to the thickness of the inner end portion 32, and thus is about half of the distance between the top and bottom surfaces 28, 30. As is apparent from FIG. 5, the recesses 36 are oriented so as to be in substantial linear alignment with each other within each set of the leads 26. The use of the recesses 36 will be described in more detail below.

Figure 7:
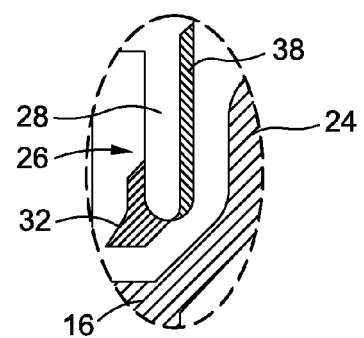
FIG. 7 is an enlargement of the encircled region 7 shown in FIG. 5.

Referring now to FIGS. 5 and 7, within each set of the leads 26 included in the leadframe 12, two of the leads 26 are disposed adjacent to respective ones of the two tie bars 24 between which such set is positioned. These two particular leads 26 of each set, which may be referred to as corner leads, are each preferably partially etched so as to define an elongate shelf 38 which is recessed relative to the top surface 28, and extends in opposed relation to the bottom surface 30. The shelf 38, which is indicated by the hatching shown in FIG. 7, extends along that side or edge of each lead 26 defining a corner lead which is disposed closest to the adjacent tie bar 24. The depth of the shelf 38 relative to the top surface 28 is preferably about equal to the depth of each of the above-described recesses 36, and thus is about half the total thickness of the lead 26 (i.e., the distance between the top and bottom surfaces 28, 30). Thus, each shelf 38 extends in generally co-planar relation to the shelves 34 of the inner end portions 32, and the bottom surfaces of the tie bars 24. The inclusion of the shelf 38 within each lead 26 defining a corner lead provides increased clearance with the adjacent tie bar 24.

Referring now to FIG. 5A, in addition to the leadframe 12, the semiconductor package 10 comprises a semiconductor die 40 which is attached to the top surface 18 of the die pad 16. More particularly, the semiconductor die 40 defines opposed, generally planar top and bottom surfaces, with the bottom surface of the semiconductor die 40 being attached to a central portion of the top surface 18 of the die pad 16 through the use of a layer 41 of a suitable adhesive. Disposed on the top surface of the semiconductor die 40 are a plurality of conductive pads 42, at least some of which are electrically connected to respective ones of the leads 26 through the use of conductive wires 44. As seen in FIGS. 4 and 5A, it is contemplated that for those pads 42 electrically connected to the leads 26, the corresponding wires 44 will extend between the pads 42 and the top surfaces 28 of corresponding ones of the leads 26. As further shown in FIG. 5A, it is also contemplated that wires 44 may be used to facilitate the electrical connection of one or more of the pads 42 to a peripheral portion of the top surface 18 of the die pad 16 to provide a grounding function.

In the semiconductor package 10, the semiconductor die 40, the wires 44, and portions of the leadframe 12 are covered by an encapsulant material which ultimately hardens into a package body 46 of the semiconductor package 10. The outline of the package body 46 is indicated by the dashed lines included in FIGS. 5 and 5A. Once the encapsulant material used to form the package body 46 is applied to the leadframe 12 and hardens, a punch singulation process is completed as is needed to effectively separate the leads 26 and the tie bars 24 from the dambar of the leadframe 12, thus electrically isolating the leads 26 and the tie bars 24 from each other. The punch singulation process also contributes to providing the package body 46 with some of its completed structural attributes, as will be described in more detail below.

As is most apparent from FIGS. 1-4, the post punch singulation package body 46 defines a generally planar top surface 48, a generally planar bottom surface 50, and a generally planar shoulder 52 which is disposed in opposed relation to the bottom surface 50. The shoulder 52 and the top surface 48 extend along respective ones of a spaced, generally parallel pair of planes, with a first side surface 54 of the package body 46 extending angularly between the top surface 48 and the shoulder 52. In addition to the first side surface 54, the package body 46 includes a second side surface 56 which extends generally perpendicularly between the bottom surface 50 and the shoulder 52.

When the encapsulant material used to form the package body 46 is initially applied to the leadframe 12, such encapsulant material flows over and covers the semiconductor die 40, the wires 44, the exposed portion of the top surface 18 of the die pad 16, and the side surfaces of the die pad 16. The encapsulant material also covers the shelf 22 of the die pad 16, though the bottom surface 20 of the die pad 16 is not covered thereby. The encapsulant material also covers the entirety of the inner end portion 32 of each of the leads 26 (including the shelves 34 defined by the inner end portions 32). Also covered by the encapsulant material is the shelf 38 included in those leads 26 defining the aforementioned corner leads.

In addition, the encapsulant material used to form the package body 46 flows into and completely fills the recesses 36 of those leads 26 including the same. Additionally, though the encapsulant material flows between adjacent pairs of the leads 26 and between those leads 26 defining the corner leads and the adjacent tie bars 24, the encapsulant material does not cover the bottom surfaces 30 of the leads 26. Further, though the encapsulant material covers a portion of the top surface 28 of each lead 26, including that portion of the top surface 28 defined by the inner end portion 32, a portion of the top surface 28 is not covered by the encapsulant material. In addition, the encapsulant material covers the entirety of the bottom surface of each tie bar 24, and a portion of the top surface thereof.

As a result of the foregoing, once the encapsulant material hardens and the aforementioned punch singulation process is completed, the completed package body 46 covers the exposed portion of the top surface 18 of the die pad 16, as well as the side surfaces of the die pad 16. The package body 46 also covers the shelf 22 of the die pad 16, thus facilitating the creation of a firm mechanical interlock between the die pad 16 and the package body 46. The bottom surface 20 of the die pad 16 is exposed in and substantially flush with the bottom surface 50 of the package body 46. The package body 46 also covers the entirety of the inner end portion 32 of each of the leads 26 (including the shelves 34 defined by the inner end portions 32), thus creating a firm mechanical interlock between the package body 46 and the leads 26. Also covered by the package body 46 is the shelf 38 included in those leads 26 defining the aforementioned corner leads. Additionally, the bottom surfaces 30 of the leads 26 are each exposed in and substantially flush with the bottom surface 50 of the package body 46 in the manner best shown in FIG. 2.

In addition to the foregoing, as shown in FIGS. 1 and 3, outer end portions of the top surfaces 28 of those leads 26 not including a recess 36 formed therein are exposed in and substantially flush with the shoulder 52 defined by the package body 46. For those leads 26 including a recess 36 disposed therein, no portions of such leads 26 are exposed in the shoulder 52. Such lack of exposure in the shoulder 52 for those leads 26 including recesses 36 is attributable to the cut line severing the leads 26 from the dambar extending through each of the recesses 36. In this regard, as best seen in FIG. 4, for each lead 26 including a recess 36, the punch singulation process results in each such lead 26 defining a shelf 37 which is disposed in opposed relation to the bottom surface 30 and recessed relative to the top surface 28, such shelf 37 being covered by the package body 46. As will be recognized, each shelf 37 is defined by what was originally a portion of the bottom surface of a corresponding recess 36 prior to the completion of the punch singulation process. Since no recesses (like the recesses 36) are formed in the top surfaces of the tie bars 24, portions of the top surfaces of the tie bars 24, like portions of the top surfaces 28 of those leads 26 not including recesses 36, are exposed in the shoulder 52 subsequent to the completion of the punch singulation process.

As is most apparent form FIG. 3, the completion of the punch singulation process also results in each of the leads defining an outer end 33 which is exposed in and substantially flush with the second side surface 56 of the package body 46. As also shown in FIG. 3, for those leads 26 including recesses 36, the height of the outer end 33 thereof is less than that for those leads 26 not including the recesses 36. The punch singulation process also results in each of the tie bars 24 defining an outer end 25 which is exposed in and substantially flush with the second side surface 56 of the package body 46. Though not shown in FIG. 3, the height of the outer end 25 of each tie bar 24 is about the same as the height of the outer ends 33 of those leads 26 including recesses 36 since, as indicated above, each of the tie bars 24 is subjected to a partial etching process during the fabrication of the leadframe 12 which effectively reduces the thickness thereof by about one-half.

The semiconductor package 10 further comprises a conformal radiation shield 58 which is applied to a portion of the package body 46. The shield 58 is typically applied to the package body 46 through the use of a plating or spray application process and, in its completed configuration, covers the top surface 48 and first side surface 54 of the package body 46. In addition, the shield 58 covers at least a portion of the shoulder 52 of the package body 46. Importantly, the shield 58 contacts and is thus electrically connected to those leads 26 not including recesses 36 and including portions of the top surfaces 28 thereof exposed within the shoulder 52. The shield 58 also contacts and is thus electrically connected to those portions of the top surfaces of the tie bars 24 which are exposed within the shoulder 52. The electrical communication between the shield 58 and one or more of the leads 26 as well as the tie bars 24 of the semiconductor package 10 may be used to provide any one of a multiplicity of desired functional attributes for the semiconductor package 10.

The method of fabricating the semiconductor package 10 comprises the initial step of providing the leadframe 12 to include the structural attributes shown in FIGS. 5 and 5A and described above. As previously indicated, the leadframe 12 may be fabricated by mechanically stamping or mechanically etching a suitable strip of conductive metal material, with the stamped or etched leadframe 12 being subjected to further partial etching as needed to facilitate the formation of those partially etched surfaces (including the shelves 22, 38 and recesses 36) indicated by the hatching included in FIGS. 5 and 5A. Subsequent to the complete fabrication of the leadframe 12, the semiconductor die 40 is attached to the die pad 16 and electrically connected to the leads 26 through the use of the wires 44 in the manner shown in FIG. 5A and also described above. Thereafter, the above-described encapsulation process is completed, with the hardening of the encapsulant material followed by a plating step wherein a suitable plating layer is applied to the exposed bottom surfaces 30 of the leads 26 and, optionally, the exposed bottom surface 20 of the die pad 16. Such plating step is typically followed by a marking step, which is thereafter followed by a plasma cleaning step. Upon the completion of the plasma cleaning step, the conformal shield 58 is formed on the hardened encapsulant material. As indicated above, formation of the conformal shield 58 is typically facilitated by a plating or spray application process followed by a drying process which may include ultraviolet radiation. The formation of the conformal shield 58 is followed by the above-described punch singulation process which, as indicated above, provides the package body 48 with its final form factor, and also completes the fabrication of the semiconductor package 10.

Figure 8:
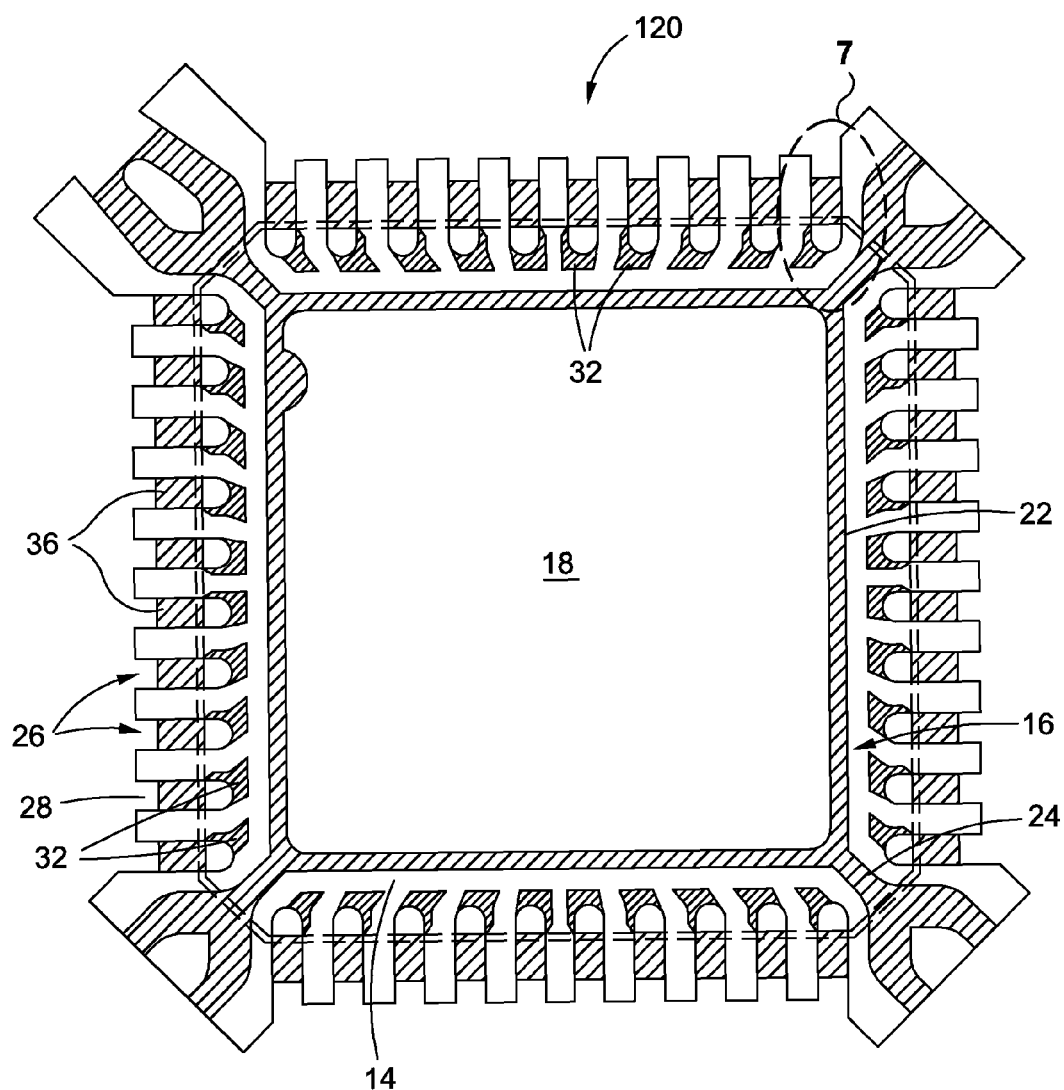
FIG. 8 is a top plan view of an alternative embodiment of the unsingulated leadframe shown in FIGS. 5 and 5A.

As indicated above, when the leadframe 12 is integrated into the semiconductor package 10, for those leads 26 including a recess 36 disposed therein, no portions of such leads 26 are exposed in the shoulder 52 of the package body 46. Additionally, since no recesses 36 are formed in the top surfaces of the tie bars 24, portions of the top surfaces of the tie bars 24, like portions of the top surfaces 28 of those leads 26 not including recesses 36, are exposed in the shoulder 52. FIG. 8 depicts a leadframe 120 which is a minor variant of the above-described leadframe 12. In this regard, the sole distinction between the leadframes 120, 12 lies in each of the leads 26 included in the leadframe 120 including a recess 36 formed within the top surface 28 thereof. Thus, if the semiconductor package 10 were fabricated to include the leadframe 120 as an alternative to the leadframe 12, no portions of any leads 26 would be exposed in the shoulder 52 of the package body 46.

Rather, only portions of the top surfaces of the tie bars 24 would be exposed in the shoulder 52. As a result, the conformal radiation shield 58 applied to the package body 46 of a semiconductor package including the leadframe 120 would electrically communicate with only one or more of the tie bars 24. In the leadframe 120, as in the leadframe 12, the tie bars 24 are each attached to the die pad 16, the bottom surface 20 of which would typically be exposed in the bottom surface 50 of the package body 46 of a semiconductor package fabricated to include the leadframe 120.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
   a semiconductor die;
   a plurality of leads extending at least partially about the semiconductor die which is electrically connected to at least some of the leads;
   a package body covering at least portions of the semiconductor die and the leads, the package body having a top surface, a bottom surface, a shoulder which is disposed in opposed relation to the bottom surface and recessed relative to the top surface, a first side surface which extends between the top surface and the shoulder, and a second side surface which extends between the shoulder and the bottom surface, the package body being formed such that one or more, but not all, of the leads include a portion which is exposed in the shoulder, and each of the leads includes a portion which is exposed in the bottom surface; and
   a conformal shield which is disposed on at least a portion of the package body and is electrically connected to any portions of the leads which are exposed in the shoulder.

2. The semiconductor package of claim 1 wherein the conformal shield covers the top surface, the first side surface and the shoulder of the package body.

3. The semiconductor package of claim 1 wherein those leads which include a portion exposed in the shoulder of the package body each comprise:
   a generally planar top surface which is partially exposed in the shoulder;
   a generally planar bottom surface which is disposed in opposed relation to the top surface and exposed in the bottom surface of the package body; and
   a shelf which is disposed in opposed relation to the top surface and recessed relative to the bottom surface, the shelf being covered by the package body.

4. The semiconductor package of claim 3 wherein those leads which include a portion exposed in the shoulder of the package body each further include an outer end which extends between the top and bottom surfaces, and is exposed in the second side surface of the package body.

5. The semiconductor package of claim 1 wherein each of the leads which does not include a portion exposed in the shoulder of the package body comprises:
   a generally planar top surface which is covered by the package body;
   a generally planar bottom surface which is disposed in opposed relation to the top surface and exposed in the bottom surface of the package body;
   a first shelf which is disposed in opposed relation to the top surface and recessed relative to the bottom surface, the first shelf being covered by the package body; and
   a second shelf which is disposed in opposed relation to the bottom surface and recessed relative to the top surface, the second shelf being covered by the package body.

6. The semiconductor package of claim 5 wherein those leads which do not include a portion exposed in the shoulder of the package body each further include an outer end which extends between the second shelf and the bottom surface, and is exposed in the second side surface of the package body.

7. The semiconductor package of claim 1 wherein:
   the semiconductor die has a generally quadrangular configuration defining four peripheral edge segments; and
   the leads are segregated into at least four sets which extend along and in spaced relation to respective ones of the peripheral edge segments of the semiconductor die.

8. The semiconductor package of claim 7 wherein alternating leads of each set thereof include a portion which is exposed in the shoulder of the package body.

9. The semiconductor package of claim 1 wherein the semiconductor die is electrically connected to at least some of the leads through the use of conductive wires which are covered by the package body.

10. The semiconductor package of claim 1 wherein each of the leads includes an inner end portion which extends at a prescribed angle relative to the remainder thereof and is covered by the package body.

11. A semiconductor package comprising:
    a die pad;
    a semiconductor die attached to the die pad;
    a plurality of leads extending at least partially about the die pad in spaced relation thereto, the semiconductor die being electrically connected to at least some of the leads;
    a package body covering at least portions of the semiconductor die, the die pad and the leads, the package body having a top surface, a bottom surface, a shoulder which is disposed in opposed relation to the bottom surface and recessed relative to the top surface, a first side surface which extends between the top surface and the shoulder, and a second side surface which extends between the shoulder and the bottom surface, the package body being formed such that one or more, but not all, of the leads include a portion which is exposed in the shoulder, a portion of the die pad is exposed in the bottom surface, and each of the leads includes a portion which is exposed in the bottom surface; and
    a conformal shield which is disposed on at least a portion of the package body and is electrically connected to any portions of the leads which are exposed in the shoulder.

12. The semiconductor package of claim 11 wherein the conformal shield covers the top surface, the first side surface and the shoulder of the package body.

13. The semiconductor package of claim 11 wherein those leads which include a portion exposed in the shoulder of the package body each comprise:
    a generally planar top surface which is partially exposed in the shoulder;
    a generally planar bottom surface which is disposed in opposed relation to the top surface and exposed in the bottom surface of the package body; and
    a shelf which is disposed in opposed relation to the top surface and recessed relative to the bottom surface, the shelf being covered by the package body.

14. The semiconductor package of claim 13 wherein those leads which include a portion exposed in the shoulder of the package body each further include an outer end which extends between the top and bottom surfaces, and is exposed in the second side surface of the package body.

15. The semiconductor package of claim 11 wherein each of the leads which does not include a portion exposed in the shoulder of the package body comprises:
   a generally planar top surface which is covered by the package body;
   a generally planar bottom surface which is disposed in opposed relation to the top surface and exposed in the bottom surface of the package body;
   a first shelf which is disposed in opposed relation to the top surface and recessed relative to the bottom surface, the first shelf being covered by the package body; and
   a second shelf which is disposed in opposed relation to the bottom surface and recessed relative to the top surface, the second shelf being covered by the package body.

16. The semiconductor package of claim 15 wherein those leads which do not include a portion exposed in the shoulder of the package body each further include an outer end which extends between the second shelf and the bottom surface, and is exposed in the second side surface of the package body.

17. The semiconductor package of claim 11 wherein the die pad defines opposed generally planar top and bottom surfaces, and a shelf which is disposed in opposed relation to the top surface and is recessed relative to the bottom surface, the shelf substantially circumventing the bottom surface and being covered by the package body.

18. The semiconductor package of claim 11 further comprising a plurality of tie bars attached to the die pad, the package body being formed such that each of the tie bars includes a portion which is exposed in the shoulder.

19. The semiconductor package of claim 18 wherein the leads which are disposed adjacent to one of the tie bars each include a shelf disposed therein which is sized and configured to provide a prescribed level of clearance with an adjacent one of the tie bars.

20. A semiconductor package comprising:
   a die pad;
   a semiconductor die attached to the die pad;
   a plurality of leads extending at least partially about the die pad in spaced relation thereto, the semiconductor die being electrically connected to at least some of the leads;
   a plurality of tie bars attached to the die pad and extending therefrom;
   a package body covering at least portions of the semiconductor die, the die pad, the tie bars and the leads, the package body having a top surface, a bottom surface, and a shoulder which is oriented between the top and bottom surfaces, the package body being formed such that at least one of the tie bars includes a portion which is exposed in the shoulder, one or more, but not all, of the leads include a portion which is exposed in the shoulder, and each of the leads includes a portion which is exposed in the bottom surface; and
   a conformal shield which is disposed on at least a portion of the package body and is electrically connected to any portion of any one of the tie bars and the leads which is exposed in the shoulder.

* * * * *